United States Patent
Mindock et al.

(10) Patent No.: US 7,561,425 B2
(45) Date of Patent: Jul. 14, 2009

(54) ENCAPSULATED MULTI-PHASE ELECTRONICS HEAT-SINK

(75) Inventors: Eric S. Mindock, Playa del Rey, CA (US); John R. Scott, Torrance, CA (US)

(73) Assignee: The Boeing Company, Chicago, IL (US)

(*) Notice: Subject to any disclaimer, the term of this patent is extended or adjusted under 35 U.S.C. 154(b) by 368 days.

(21) Appl. No.: 11/422,730

(22) Filed: Jun. 7, 2006

(65) Prior Publication Data

US 2007/0285892 A1  Dec. 13, 2007

(51) Int. Cl.
*H05K 7/20* (2006.01)
*H01L 23/34* (2006.01)
*F28F 7/00* (2006.01)

(52) U.S. Cl. .............. 361/700; 257/714; 174/15.1; 174/252; 165/80.4; 165/80.5

(58) Field of Classification Search ............... 361/699, 361/700; 257/714; 174/15.1, 252; 165/80.4, 165/80.5
See application file for complete search history.

(56) References Cited

U.S. PATENT DOCUMENTS

| | | | | |
|---|---|---|---|---|
| 4,833,567 A * | 5/1989 | Saaski et al. | ............... | 361/700 |
| 5,198,889 A * | 3/1993 | Hisano et al. | ............... | 257/678 |
| 5,522,452 A * | 6/1996 | Mizuno et al. | ............... | 165/286 |
| 5,907,473 A * | 5/1999 | Przilas et al. | ............... | 361/699 |
| 5,943,211 A * | 8/1999 | Havey et al. | ............... | 361/699 |
| 6,064,572 A * | 5/2000 | Remsburg | ............... | 361/700 |
| 6,085,831 A | 7/2000 | DiGiacomo et al. | | |
| 6,433,425 B1 * | 8/2002 | Sarkhel | ............... | 257/737 |
| 6,550,263 B2 * | 4/2003 | Patel et al. | ............... | 62/259.2 |
| 6,550,531 B1 * | 4/2003 | Searls et al. | ............... | 165/104.33 |
| 6,608,752 B2 * | 8/2003 | Morris et al. | ............... | 361/700 |
| 6,687,124 B2 | 2/2004 | Ostby | | |
| 6,817,196 B2 * | 11/2004 | Malone et al. | ............... | 62/171 |
| 2003/0197252 A1 | 10/2003 | Budelman | | |

FOREIGN PATENT DOCUMENTS

JP  61279157 A  12/1986

OTHER PUBLICATIONS

PCT International Search Report and Written Opinion for International Application PCT/US2007/011088.

(Continued)

*Primary Examiner*—Jayprakash N Gandhi
*Assistant Examiner*—Zachary M Pape
(74) *Attorney, Agent, or Firm*—Bradley K. Lortz; Canandy & Lortz LLP

(57) ABSTRACT

An apparatus and method for cooling electronics is disclosed. An encapsulated inert non-conductive fluid is used to transfer heat directly from an electrical circuit including a die on a substrate to an external heatsink. The top of a flip chip die (e.g. a ceramic column grid array flip chip) may be enclosed with a metallic cover. The metallic cover is sealed to an outer frame, which in turn is sealed to metallization on the top of the flip chip through a flexure, minimizing mechanical load imparted to the flip chip. This forms a hermetic cavity enclosing the die. This hermetic cavity is partially filled with an inert non conductive fluid, which vaporizes when heated. Condensation occurs on the inner surface of the metal cover where the heat may be conducted into the outer frame for removal (e.g. rejection from the spacecraft).

26 Claims, 6 Drawing Sheets

OTHER PUBLICATIONS

Scientific American.com, "Cooling Hot Chips", http://www.sciam.com/article.cfm?articleID=000A5B71-C954-1CDB-B4A8809EC588EEDF, Aug. 3, 1998.

Va Newswire, "Intel Dual Core Processor Systems Announced by Velocity Micro," http://www.vanewswire.com/issues/issue173.html, Apr. 4, 2005.

* cited by examiner

ENCAPSULATED MULTI-PHASE ELECTRONICS HEAT-SINK

BACKGROUND OF THE INVENTION

1. Field of the Invention

This invention relates to heat dissipation in electrical circuits. Particularly, this invention relates heat dissipation in electrical circuits for space applications.

2. Description of the Related Art

In electrical circuits for space applications and generally, heat dissipation requirements tend to increase with more capable electronics. Conventional designs commonly employ heat-sinks mechanically fastened to the die, i.e. bonded to the die and local area of a printed wiring board (PWB), or vias under an ASIC and removed from the die heat-source. However, these designs commonly result in multiple thermal choke points. Thus, improving performance with conventional techniques requires updating design at multiple thermal interfaces. High performance thermal bonds are required, as well as a highly conductive but mechanically compliant heat-sink material. As the power dissipation increases much more area is required to transfer heat away.

Although circuit cooling has been developed using non-conductive liquid, such cooling systems require special architechtures and complex components which designed integrally with the circuit they are intended to cool. For example, microchannels for conducting cooling fluid have been developed which flow under capilary pressure. In addition, other self-contained fluid cooling systems for electronic circuits have been developed for personal computers. Some other circuit cooling systems may employ heat pipes. However, none of the developed systems lend themselves to being easily integrated with an existing chip type or retrofitted to an existing circuit design.

U.S. Pat. No. 6,687,124, by Ostby, issued Feb. 3, 2004, discloses an apparatus for cooling electronic components disposed in a sealed container in a phase change electronic cooling system including a hood disposed in the container adjacent the electronic components. The electronic components and the hood are immersed in a nonconductive liquid that partially fills the container when the container is in a predetermined location relative to the ground. The apparatus also includes at least one cooling tube having one end connected to the hood and an opposite end disposed adjacent a portion of the electronic components whereby during operation the electronic components transfer heat to the liquid, causing the liquid below the hood to vaporize forming bubbles, the bubbles traveling through the at least one tube and carrying an entrained portion of the liquid to said opposite end. When the container is oriented to expose the portion of the electronic components above the liquid level, the bubbles and the entrained liquid exit the opposite end of the at least one tube onto the exposed portion of the electronic components to cool the exposed portion of the electronic components.

In space applications, the ability to effectively transfer excess heat to space has not kept pace with the demands of the higher power electronics being employed. For example, transferring approximately 20-50W of heat from a smaller than one inch square ASIC die with a minimal temperature rise would be highly desireable. Various space vehicles, e.g. communication satellites, typically employ a large number electrical circuits in the systems which operate them. Each of these circuits must include a proper thermal design to remove excess heat developed during the operation of the circuit.

In view of the foregoing, there is a need in the art for apparatuses and methods for efficiently dissipating heat developed in electrical circuits. In addition, there is a need for such apparatuses and methods to be readily integrated with existing chip types. There is also a need for such apparatuses and methods that can be easily retrofitted to an existing circuit design. There is further a need for such systems and apparatuses in space applications. Theses and other needs are met by the present invention as detailed hereafter.

SUMMARY OF THE INVENTION

An apparatus and method for cooling electronics is disclosed. An encapsulated inert non-conductive fluid is used to transfer heat directly from an electrical circuit to an external heat-sink. The electrical circuit may comprise a die on a substrate of a known type, e.g. a ceramic column grid array flip chip (CCGA), which is enclosed with a metallic cover. The metallic cover is sealed to an outer frame, which in turn is sealed to metallization on the top of the flip chip through a flexure, minimizing mechanical load imparted to the flip chip. This forms a hermetic cavity enclosing the die. This hermetic cavity is partially filled with an inert non conductive fluid, which vaporizes when heated. Condensation occurs on the inner surface of the metal cover where the heat may be conducted into the outer frame for removal (e.g. rejection from the spacecraft). For applications in zero gravity (or micro gravity), or under small adverse accelerations, a wicking structure may be employed in the hermetic cavity to facilitate fluid circulation within the cavity.

Embodiments of the invention enable high heat dissipation from an electrical die (e.g. up to approximately 50W), thus improving the electrical capabilities of a given circuit. A temperature rise of approximately 20° C. from a die to the heat-sink with a 50W dissipation may be achieved, equivalent to the current state of the art for a conventional 20W application specific integrated circuit (ASIC) in a spacecraft application.

A typical embodiment of the invention comprises an apparatus for cooling electronics, including an electronic circuit, a metallic cover over and sealed to the electronic circuit forming a hermetic cavity, and a non-conductive fluid partially filling the hermetic cavity. The non-conductive fluid may undergo a first phase change from a liquid to a gas while absorbing heat energy from the electronic circuit and a second phase change back from the gas to the liquid while dissipating the heat energy through the metallic cover. The non-conductive fluid may be selected from the group consisting of a perfluorocarbon and a segregated hydrofluoroether.

In some embodiments, the metallic cover may comprises one or more heat transfer enhancements for improving heat rejection from the metallic cover. For example, the metallic cover may be modified in shape to include the addition of penetrations or conduits for fluid transfer into and out of the cavity as one form of external heat transfer enhancement. Other forms of external heat transfer enhancements may include modifications of the metallic cover such as using a flat surface on the metallic cover, onto which external attachments may be disposed to further enhance heat rejection through the metallic cover from the electronics.

Some examples of attached external heat transfer enhancement that can be achieved through modification of the metallic cover include attachment of conductive straps, use of a top cover with external extruded fins (for terrestrial convective environments), and use of a cover with an external cavity for attachment to conventional liquid cooling systems. In general, the surface area of the cover (e.g. external surface area)

may be increased to much greater than that of the electronic die, reducing thermal resistances in the heat rejection path from the cover to the heat rejection medium attached to (or surrounding) the metallic cover. Further modification of the metallic cover can allow penetration into the cavity adjacent to the electronics, enabling direct impingement spray cooling onto the electronics to achieve further cooling enhancement.

Modifications of the metallic cover in conjunction with the flexure can allow separation of the thermal and mechanical paths such that loads transferred from the metallic cover to the fixed frame are not imparted directly to the sensitive electronic components while heat energy is still transferred from the electronics to the metallic cover.

In other embodiments, an outer frame fixed to a printed wiring board (PWB) surrounding the electronic circuit and supporting the metallic cover is used. Heat may be removed from the electronic circuit by being transferred in sequence from the non-conductive fluid to the metallic cover to the outer frame. The metallic cover may comprise a flexure sealed to metallization on top of the electronic circuit and sealed to the outer frame. The flexure can reduce mechanical load imparted to the electronic circuit.

In some embodiments, the electronic circuit comprises a die on a substrate joined to a printed wiring board (PWB) through a plurality of electrical interconnects. The electrical interconnects may comprise solder interconnects in a grid array, such as in a ceramic column grid array (CCGA). Thus, the substrate may comprise a ceramic.

Similar to the apparatus embodiment, a typical method embodiment of the invention may include the operations of providing an electronic circuit, sealing a metallic cover over the electronic circuit to form a hermetic cavity over the electronic circuit, and partially filling the hermetic cavity with a non-conductive fluid. The method may be further modified in a manner consistent with the apparatus embodiments described herein.

BRIEF DESCRIPTION OF THE DRAWINGS

Referring now to the drawings in which like reference numbers represent corresponding parts throughout.

DETAILED DESCRIPTION OF THE PREFERRED EMBODIMENT

1. Overview

As previously mentioned, embodiments of the invention are directed to an encapsulated inert non-conductive fluid used to transfer heat directly from an electrical circuit to an external heat-sink. The top of a chip die is enclosed with a metallic cover. The cover is sealed to an outer frame, which in turn is sealed to metallization on the top of the chip through a flexure, minimizing mechanical load into the chip. This forms a hermetic cavity in which the circuit of the chip resides. This cavity is filled with an inert non conductive fluid, which vaporizes when heated. Condensation occurs on the metal cover where the heat is transported into the outer frame for rejection into the spacecraft. Embodiments of the invention provide more efficient cooling than conventional heat-sinks. In addition, embodiments of the invention may be readily implemented with known chip types and retrofitted to existing circuits.

Embodiments of the invention generally require a smaller footprint on a printed wiring board than conventional circuit cooling solutions. This allows for more electrical connections and thus an increase in the overall efficiency of a given circuit layout on a printed wiring board. In addition, embodiments of the invention may be used to increase the current ASIC dissipation capability from approximately 10 W per ASIC to up to 50 W per ASIC. This reduces the need for high performance heat sinks at the printed wiring board level.

Collected data indicates approximately 0.59° C./W cooling achievable with approximately 40 watts applied to an example test chip. With the example test chip employing an embodiment using a direct impingement spray at approximately 50° C., temperature sensors of the test chip reported approximately 74° C. With minor refinements and optimization, the performance it may be possible to obtain double this performance, i.e., approximately 0.2 to 0.3° C./W. Accordingly, embodiments of the invention may enable approximately 2.5 to 3 times the DSP processing capability (as measured in thermal dissipation). Any circuit manufacturer including application specific integrated circuit (ASIC) developers and/or heat-sink manufacturer may use embodiments of the invention for implementation in space based and/or terrestrial electronic circuit cooling.

2. Encapsulated Multi-Phase Fluid for Cooling Electronics

Figure 1A:
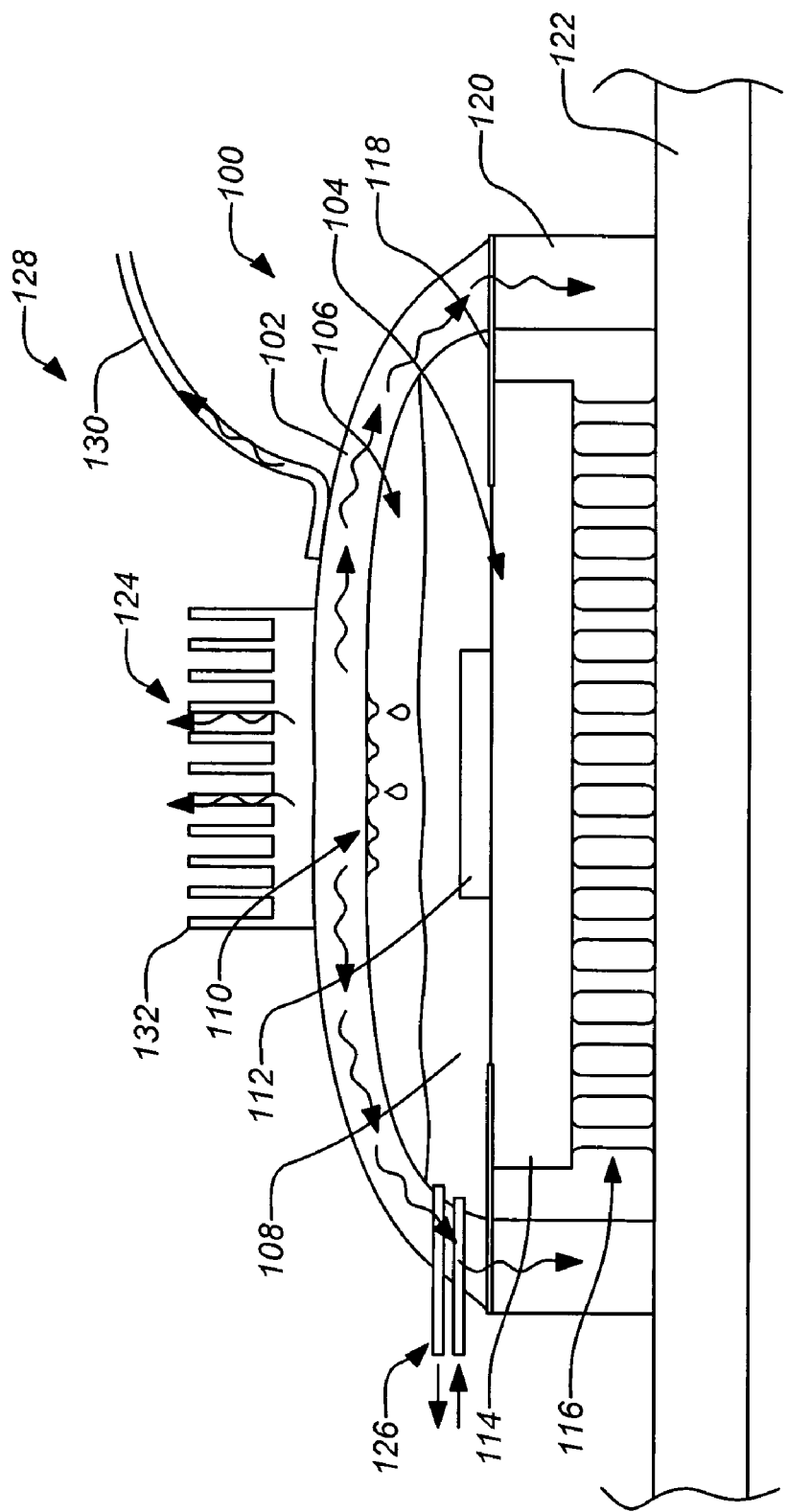
FIG. 1A illustrates a side view cross section of a hermetic cavity on an electronic circuit filled with a biphase cooling fluid.

FIG. 1A illustrates a side view cross section of a hermetic cavity on an electronic circuit filled with a biphase cooling fluid. The cooling apparatus 100 includes a metallic cover 102 disposed over the electronic circuit 104 forming a hermetic cavity 106. The hermetic cavity 106 is partially filled with a non-conductive fluid 108 capable of vaporizing (boiling) at a temperature below the steady state temperature of the electronic circuit 104 at the operating wattage. The non-conductive fluid 108 partially fills the hermetic cavity 106 such that an unfilled portion of the hermetic cavity 106 may accommodate a phase change of the fluid 108 from liquid to gas as heat energy is absorbed by the fluid 108 as a liquid against the electronic circuit 104. The heat energy is then transferred to the metallic cover 102 as the fluid 108 condenses back to a liquid on the interior surface 110 of the metallic cover 102 and returns to the liquid state fluid 108. Thus, the non-conductive fluid 108 undergoes a first phase change from a liquid to a gas while absorbing heat energy from the electronic circuit 104 and a second phase change back from the gas to the liquid while dissipating the heat energy through the metallic cover 102.

Figure 1B:
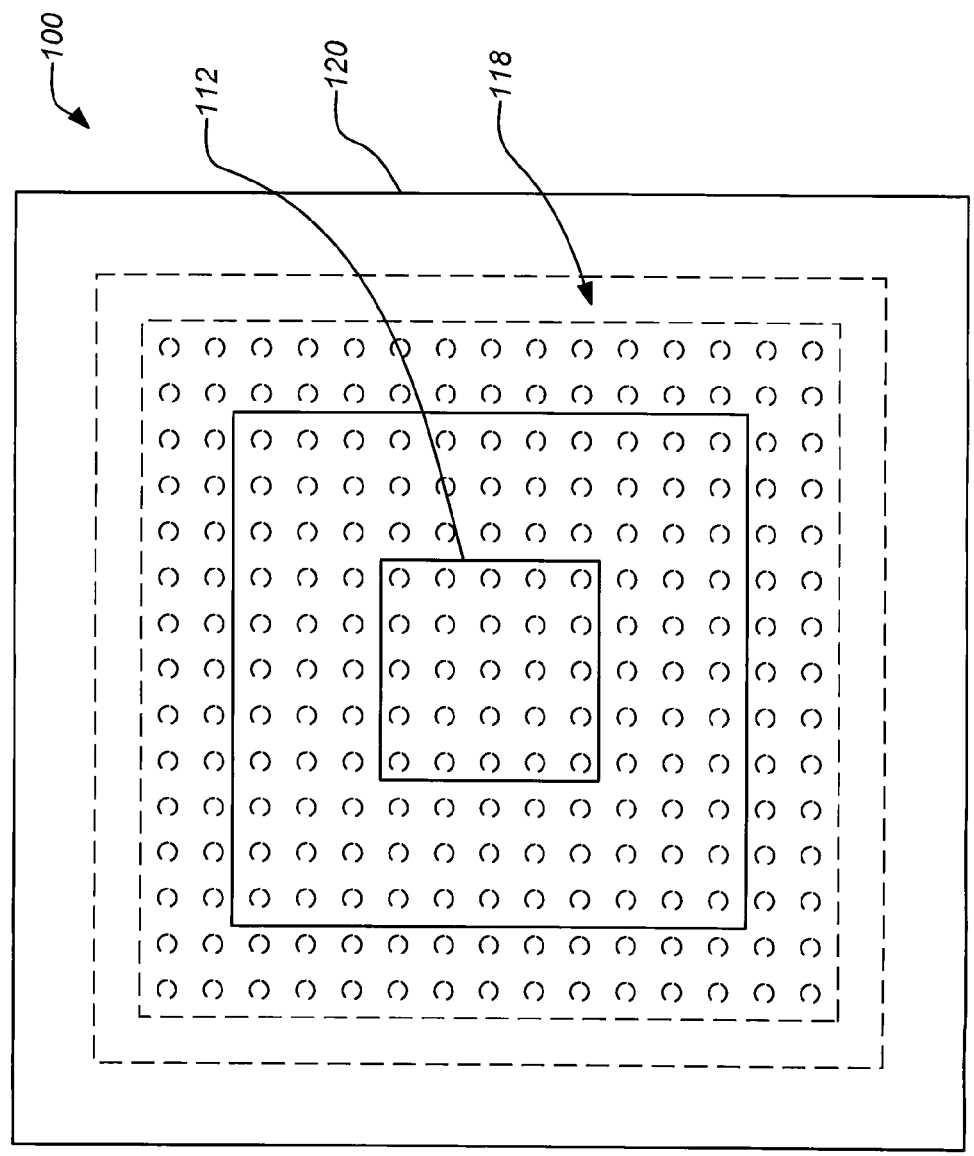
FIG. 1B illustrates a top view cross section of the hermetic cavity over an electronic circuit filled with a biphase cooling fluid.

FIG. 1B illustrates a top view cross section of the hermetic cavity 106 over the electronic circuit 104 filled with the biphase cooling fluid 108. In a typical chip implemented in an embodiment of the invention, the electronic circuit 104 will include a die 112 on a substrate 114 that is joined to a printed wiring board (PWB) 122 through a plurality of electrical interconnects 116. The substrate comprises may comprise a ceramic. FIGS. 1A and 1B illustrate packaging of a chip employing a ceramic column grid array (CCGA) known in the art. It should be noted however, that a typical CCGA implementation will employ a much higher interconnect density than depicted. Advantageously, embodiments of the invention may also be employed with other known electronics packaging technologies.

Referring back to FIG. 1A, the metallic cover may optionally comprises one or more heat transfer enhancements for improving heat rejection from the metallic cover. For example, the metallic cover may be modified in shape to include the addition of penetrations or conduits 126 for fluid transfer into and out of the cavity as one form of external heat transfer enhancement. Other forms of external heat transfer enhancements may include modifications of the metallic cover such as using a flat surface on the metallic cover, onto which external attachments 128 may be disposed to further enhance heat rejection through the metallic cover from the electronics. For example, such external attachments may include conductive straps 130, use of a metallic cover with external extruded fins 132 (for terrestrial convective environments), and use of a metallic cover with an external conduits 126 for attachment to conventional liquid cooling systems as previously mentioned. Implementation of such external attachments will be understood by those skilled in the art. In general, the surface area of the cover (e.g. external surface area) may be increased to much greater than that of the electronic die, reducing thermal resistances in the heat rejection path from the cover to the heat rejection medium attached to (or surrounding) the metallic cover. Further modification of the metallic cover can allow penetration into the cavity adjacent to the electronics, enabling direct impingement spray cooling onto the electronics to achieve further cooling enhancement.

Figure 2A:
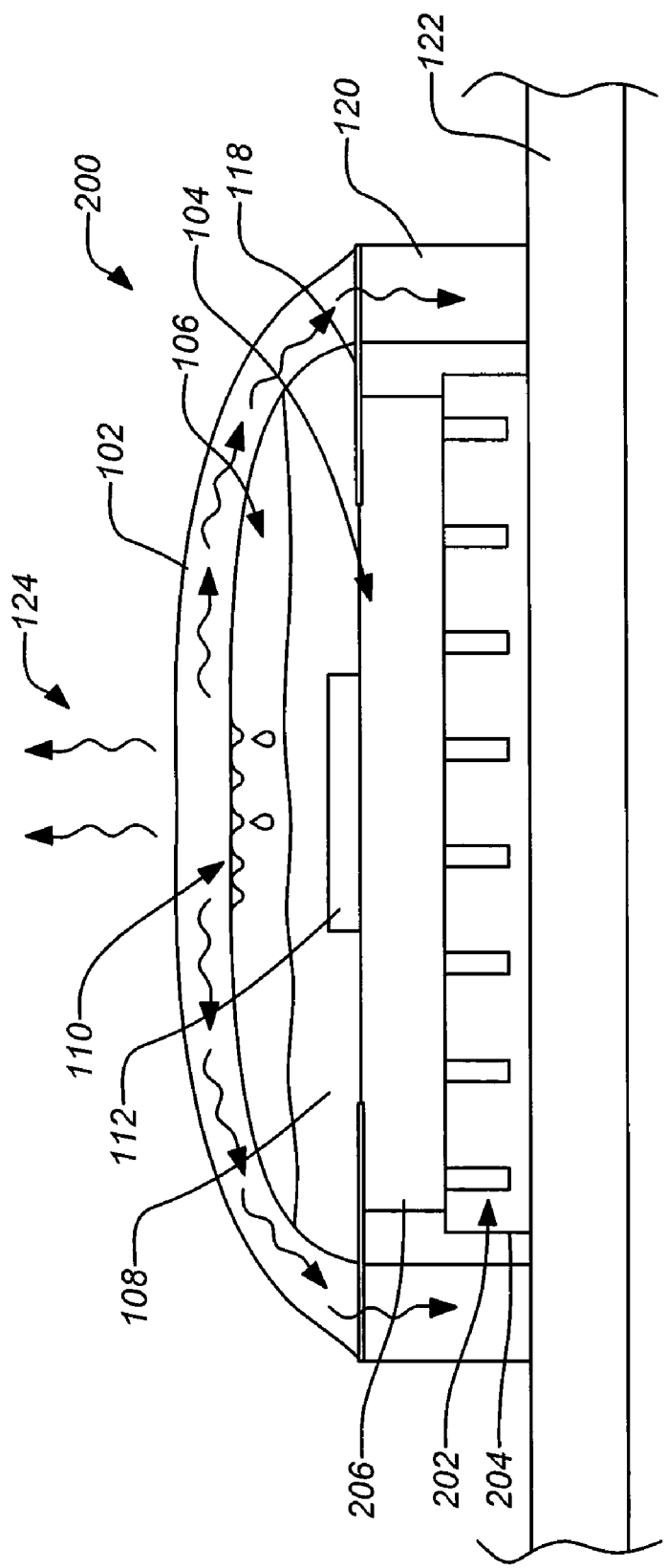
FIGS. 2A and 2B embodiments of the invention applied to electronic circuit conventional electrical interconnects and a flip chip ball grid array.
Figure 2B:
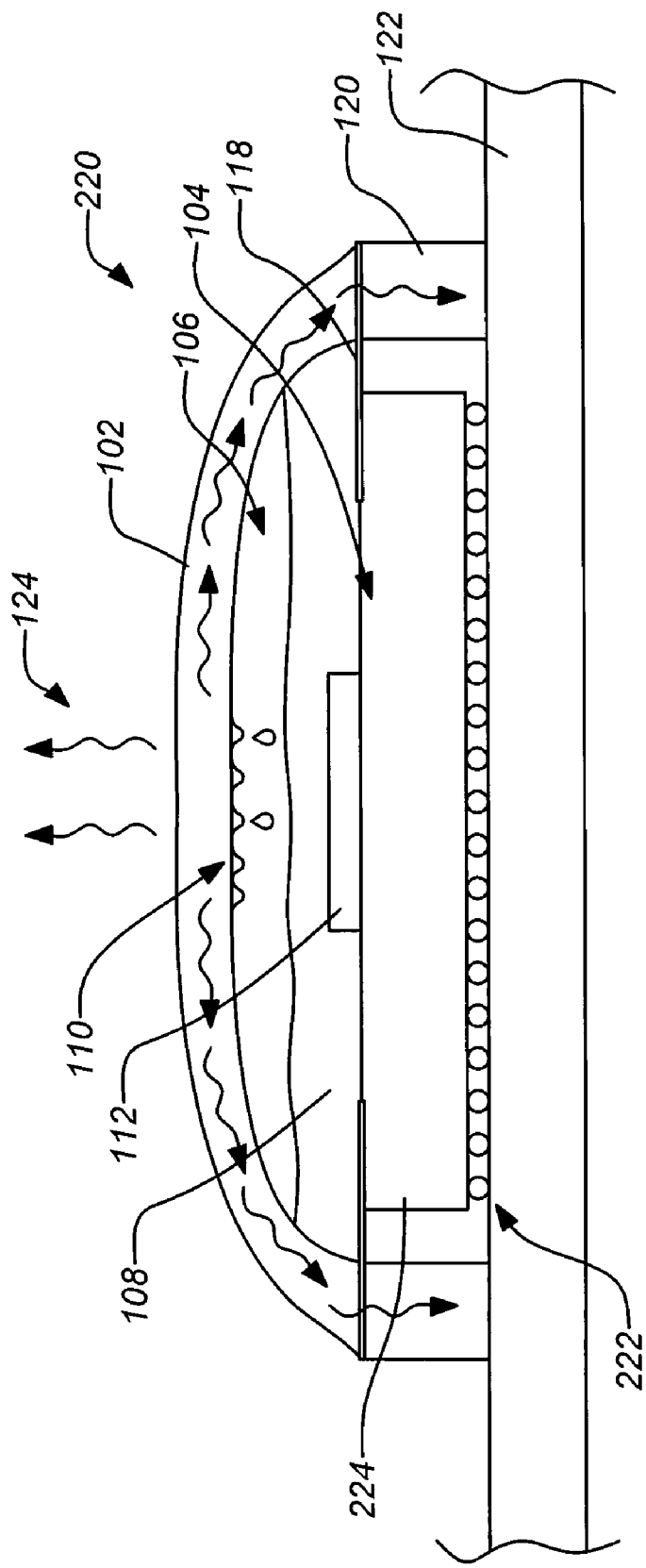

FIGS. 2A and 2B embodiments of the invention applied to electronic circuit conventional electrical interconnects (e.g. pin grid array) and a flip chip ball grid array (BGA). Note that the representations in FIGS. 1A to 2B are not to scale. The density of interconnects for a CCGA and BGA is typically significantly higher than the older pin grid array as is known in the art. FIG. 2A illustrates a cooling apparatus 200 embodiment of the invention employed with a conventional pin grid array. Here, a plurality of pins 202 extend from the bottom of the substrate 206 and are engaged into a connector 204 mounted to the PWB 122. FIG. 2B illustrates a cooling apparatus 220 embodiment of the invention employed with a flip chip BGA. This embodiment is very similar to the CCGA, however, a plurality of solder balls 222 are employed as the electrical interconnects arranged in a grid on the bottom of the substrate 224 instead of columns. As shown, embodiments of the invention are versatile and may be applied to known electronics packaging technologies. In a similar manner, embodiments of the invention may also be retrofitted to cool existing circuit designs. The apparatuses 200 and 220 of FIGS. 2A and 2B, respectively, operate in the same manner as described respecting the apparatus 100 of FIGS. 1A and 1B.

Embodiments of the invention may also utilize an outer frame 120 fixed to the PWB 122 surrounding the electronic circuit 104 and supporting the metallic cover 102. The surrounding outer frame 120 further supports versatility in adapting and/or retrofitting with the invention. In this case, the metallic cover 102 comprises a flexure 118 that is sealed to metallization on top of the electronic circuit and sealed to the outer frame 120. Thus, this flexure 118 can be used to complete the hermetic cavity 106 directly onto the circuit 104. The flexure 118 is thin in order to reduce any mechanical load that might be imparted to the electronic circuit. This minimizes additional fatigue which would otherwise be applied to the electrical interconnects. In addition, the flexure 118 is thin enough to choke off any significant heat transfer that would otherwise find a return path to the circuit 104. Heat is removed from the electronic circuit 104 being transferred in sequence from the non-conductive fluid 108 to the metallic cover 102 to the outer frame 120.

The heat from the electronic circuit 104 transferred to the metallic cover 102 with the non-conductive fluid 108 may be dissipated through one or more techniques depending upon the particular application. For example, in space applications operating in a vacuum, heat may be conducted away from the operating circuit through the PWB. In addition, some heat may be dissipated radiatively from the outer surface of the metallic cover 102. In other applications operating in air, the heat may be dissipated through convention (forced convection and/or free convention) from the outer surface of the metallic cover 102. In either case, some surface heat dissipation 124 (convective and/or radiative) may be achieved directly from the outer surface of the metallic cover 102.

The non-conductive fluid 108 employed in any of the embodiments of the invention may be one of newer type a dielectric fluid that may be used for electronic circuit cooling. For example, perfluorocarbons and segregated hydrofluoroethers are examples of such fluids. The 3M Corporation has developed a family of fully-fluorinated compounds known as perfluorocarbons (PFCs) identified by the trade name Fluorinert. These fluids are dielectric and may be selected with different boiling points depending upon the particular thermal design. In addition, 3M has also developed a family of segregated hydrofluoroethers identified by the trade name Novec. The segregated hydrofluoroethers are also dielectric and may be selected with different boiling points depending upon the particular thermal design. In addition, segregated hydrofluoroethers have low global warming potential, whereas perfluorocarbons have been designated as having a high global warming potential. In one example, the non-conductive fluid 108 may be implemented in an embodiment of the invention as the segregated hydrofluoroethers designated HFE-7100 from the 3M Corporation.

Figure 3:
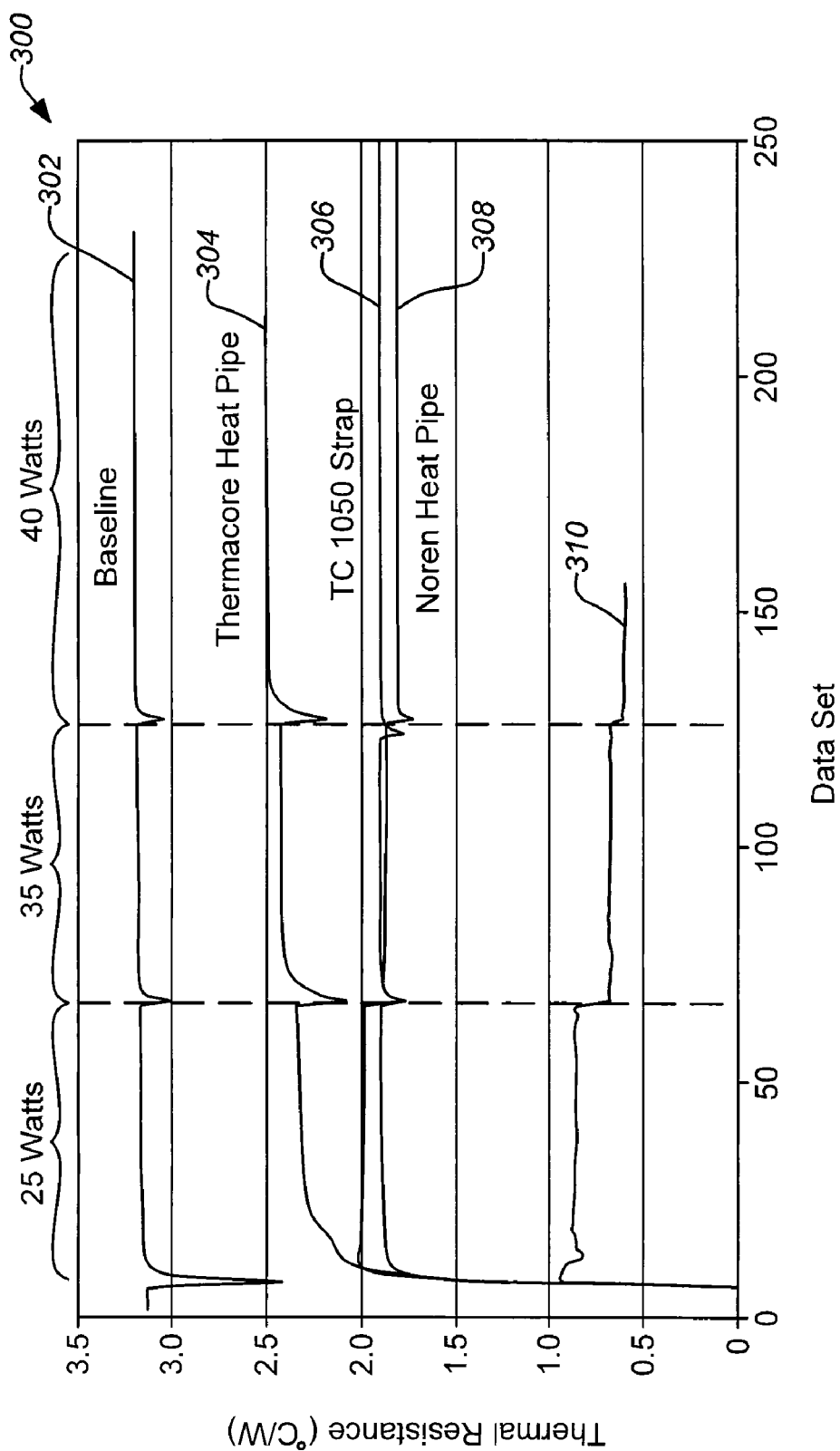
FIG. 3 illustrates a comparative graph of different cooling techniques applied to an electric circuit.

FIG. 3 illustrates a comparative graph 300 of different cooling techniques applied to an electric circuit to remove heat from the electronic circuit of a test chip. The baseline plot 302 show the thermal resistance in ° C./W of an example test chip without any cooling other than through the conventional package attachments (thermal and electrical connections at the package attachment locations). Two plots 304, 308 show the thermal resistance for two different types of heat pipes applied to the test chip, a Thermacore heat pipe and a Noren copper-water heat pipe, respectively. Another plot 306 shows the thermal resistance using a thermal pyrolytic graphite strap, TC1050® from GE Advanced Ceramics encapsulated in Aluminum. For each tested thermal solution, three different power levels (25 Watts, 35 Watts and 40 Watts) were applied to the test chip and allowed to reach a steady state as indicated by the discontinuities in the plots across the data sets. The comparative graph 300 shows up to approximately a six times increase in thermal performance from the junction to the working fluid when comparing the baseline plot 302 to the open system direct impingement fluid plot 310. Subsequent analyses have indicated embodiments of the invention may support as much as a 20° C. temperature difference from the die to the heat sink. Analyses of embodiments using a hermetic cavity not allowing direct spray impingement can indicate performance ranging from approximately 1° C./W to 2.5° C./W (depending on the attachment method to the cover outer surface) showing comparable or improved performance to the alternate cooling methods shown in graph 300.

As illustrated by the graph 300, heat pipes appear to be a worse performing design alternative as shown by the Thermacore heat pipes plot 304. Increasing the power to the test chip with the Thermacore heat pipe resulted in diminished thermal performance—approximately 2.5° C./W. Each of the three tested power levels showed increasing thermal resistance with increasing power using the Thermacore heat pipe. Similarly, the Noren heat pipe showed inferior performance compared with an embodiment of the invention as indicated by the Noren heat pipe plot 308. However, the Noren heat pipe exhibited a trend opposite that of the Thermacore heat pipe with increasing power. Increasing the power to the test chip resulted in increased thermal performance using the Noren heat pipe, approximately 1.8° C./W. Here also, this trend was confirmed across the three tested power levels. The TC1050 strap exhibited a plot 306 that appeared independent of heat flux and showed substantially consistent thermal resistance at all power levels comparable to Noren heat pipe at approximately 1.8° C./W.

In addition, a variation of liquid cooling was also compared, direct impingement. The direct spray impingement plot 310 shown in the graph 300 reveals improving thermal resistance at higher power levels, as well as increased performance over the other tested methods. However, when applied to embodiments of the invention, nucleate boiling (i.e. a stagnate fluid with no spray) is expected to have similar or better than some heat-pipe configurations (including those tested). Embodiments of the invention place the electronics within the cooling fluid (in a manner analogous to placement inside a heat-pipe), reducing the high resistances associated with external die to heat pipe attachments.

3. Method of Cooling with an Encapsulated Multi-Phase Fluid

Embodiments of the invention also encompass a method of cooling an electronic circuit consistent with the foregoing apparatus. The initial object is to form a hermetic cavity over the electronic circuit to be cooled and partially fill it with an appropriate non-conductive fluid. However, the use of the outer frame and flexure significantly improve the technique.

Figure 4:
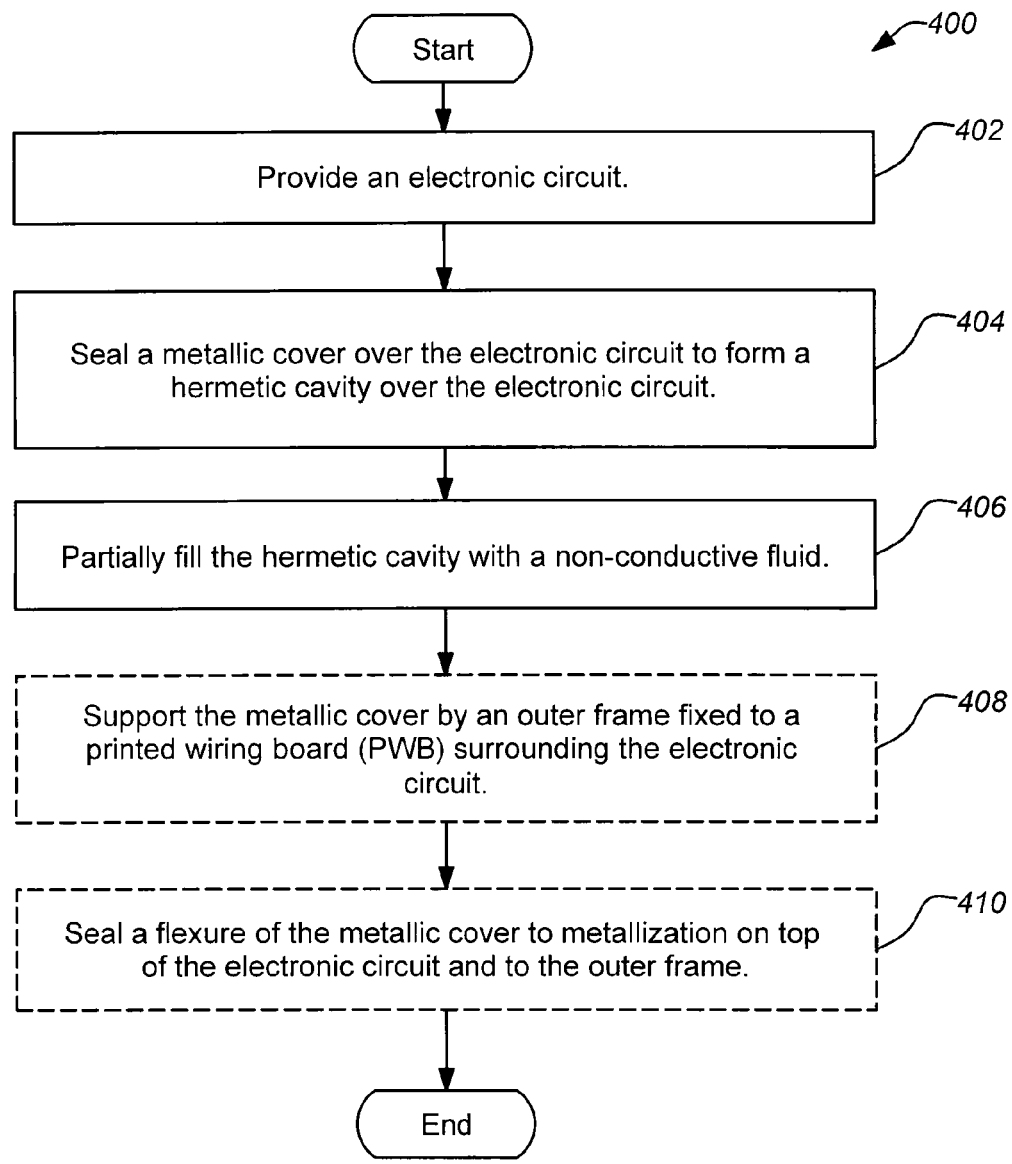
FIG. 4 is a flowchart of a method of cooling an electronic circuit according to the invention.

FIG. 4 is a flowchart of an exemplary method 400 of cooling an electronic circuit. The method 400 begins with an operation 402 of providing an electronic circuit. Next, in operation 404, a metallic cover is sealed over the electronic circuit to form a hermetic cavity over the electronic circuit. In operation 406, the hermetic cavity is partially filled with a non-conductive fluid. The method 400 may be further enhanced through optional operations in order to further develop the apparatus described in the foregoing section.

In optional operation 408, the metallic cover is supported by an outer frame fixed to a printed wiring board (PWB) surrounding the electronic circuit. In optional operation 410, a flexure of the metallic cover is sealed to metallization on top of the electronic circuit and sealed to the outer frame. The flexure reduces mechanical load imparted to the electronic circuit and heat is removed from the electronic circuit being transferred in sequence from the non-conductive fluid to the metallic cover to the outer frame.

Note that the order of operations of forming and filling the hermetic cavity may be altered as necessary to achieve the sealed hermetic cavity with the non-conductive fluid partially filing the cavity. In one example the cavity may be sealed to the electronic circuit with the fluid already partially filling the cavity. In another example, the heretic cavity may be sealed over the electronic circuit and then the fluid is filled through a temporary opening (e.g. in the top surface of the metallic cover) which is then resealed. Those skilled in the art will recognize manufacturing alternatives in order to achieve the desired goal of a partially filled hermetic cavity sealed over the electronic circuit.

This concludes the description including the preferred embodiments of the present invention. The foregoing description including the preferred embodiment of the invention has been presented for the purposes of illustration and description. It is not intended to be exhaustive or to limit the invention to the precise forms disclosed. Many modifications and variations are possible within the scope of the foregoing teachings. Additional variations of the present invention may be devised without departing from the inventive concept as set forth in the following claims.

What is claimed is:

1. An apparatus for cooling electronics, comprising:
an electronic circuit;
a metallic cover over and sealed to the electronic circuit forming a hermetic cavity;
a non-conductive fluid partially filling the hermetic cavity; and
an outer frame surrounding the electronic circuit and supporting the metallic cover;
wherein the metallic cover comprises a flexure sealed to metallization on top of the electronic circuit and sealed to the outer frame and the flexure reduces mechanical load imparted to the electronic circuit.

2. The apparatus of claim 1, wherein the non-conductive fluid undergoes a first phase change from a liquid to a gas while absorbing heat energy from the electronic circuit and a second phase change back from the gas to the liquid while dissipating the heat energy through the metallic cover.

3. The apparatus of claim 1, wherein the non-conductive fluid is selected from the group consisting of a perfluorocarbon and a segregated hydrofluoroether.

4. The apparatus of claim 1, wherein heat is removed from the electronic circuit being transferred in sequence from the non-conductive fluid to the metallic cover to the outer frame.

5. The apparatus of claim 1, wherein the metallic cover comprises one or more heat transfer enhancements for improving heat rejection from the metallic cover.

6. The apparatus of claim 5, wherein the one or more heat transfer enhancements for improving heat rejection from the metallic cover comprises conduits for fluid transfer into and out of the hermetic cavity.

7. The apparatus of claim 5, wherein the one or more heat transfer enhancements for improving heat rejection from the metallic cover comprises one or more conductive straps.

8. The apparatus of claim 5, wherein the one or more heat transfer enhancements for improving heat rejection from the metallic cover comprises external extruded fins on the metallic cover.

9. The apparatus of claim 1, wherein the electronic circuit comprises a die on a substrate joined to a printed wiring board (PWB) through a plurality of electrical interconnects.

10. The apparatus of claim 9, wherein the electrical interconnects comprise solder interconnects in a grid array.

11. The apparatus of claim 9, wherein the substrate comprises a ceramic.

12. A method of cooling electronics, comprising:
providing an electronic circuit;
sealing a metallic cover over the electronic circuit to form a hermetic cavity over the electronic circuit;
partially filling the hermetic cavity with a non-conductive fluid;
supporting the metallic cover by an outer frame surrounding the electronic circuit; and sealing a flexure of the metallic cover to metallization on top of the electronic circuit and sealing the flexure of the metallic cover to the outer frame;

wherein the flexure reduces mechanical load imparted to the electronic circuit.

13. The method of claim 12, wherein the non-conductive fluid undergoes a first phase change from a liquid to a gas while absorbing heat energy from the electronic circuit and a second phase change back from the gas to the liquid while dissipating the heat energy through the metallic cover.

14. The method of claim 12, wherein the non-conductive fluid is selected from the group consisting of a perfluorocarbon and a segregated hydrofluoroether.

15. The method of claim 12, wherein heat is removed from the electronic circuit being transferred in sequence from the non-conductive fluid to the metallic cover to the outer frame.

16. The method of claim 12, wherein the metallic cover comprises one or more heat transfer enhancements for improving heat rejection from the metallic cover.

17. The method of claim 16, wherein the one or more heat transfer enhancements for improving heat rejection from the metallic cover comprises conduits for fluid transfer into and out of the hermetic cavity.

18. The method of claim 16, wherein the one or more heat transfer enhancements for improving heat rejection from the metallic cover comprises one or more conductive straps.

19. The method of claim 16, wherein the one or more heat transfer enhancements for improving heat rejection from the metallic cover comprises external extruded fins on the metallic cover.

20. The method of claim 12, wherein the electronic circuit comprises a die on a substrate joined to a printed wiring board (PWB) through a plurality of electrical interconnects.

21. The method of claim 20, wherein the electrical interconnects comprise solder interconnects in a grid array.

22. The method of claim 20, wherein the substrate comprises a ceramic.

23. An apparatus for cooling electronics, comprising:

an electronic circuit;

a metallic covering means for sealing a metallic cover over the electronic circuit and forming a hermetic cavity over the electronic circuit;

a non-conductive fluid means for partially filling the hermetic cavity and for transferring heat energy away from the electronic circuit through the metallic covering means; and an outer frame surrounding the electronic circuit and supporting the metallic cover:

wherein the metallic cover comprises a flexure sealed to metallization on top of the electronic circuit and sealed to the outer frame and wherein the flexure reduces mechanical load imparted to the electronic circuit.

24. The apparatus of claim 23, wherein the metallic covering means comprises conduits for fluid transfer into and out of the hermetic cavity for improving heat rejection from the metallic covering means 25. The apparatus of claim 23, wherein the metallic covering means comprises one or more conductive straps for improving heat rejection from the metallic covering means.

26. The apparatus of claim 23, wherein the metallic covering means comprises external extruded fins on the metallic covering means for improving heat rejection from the metallic covering means.

* * * * *